US009202912B2

(12) United States Patent
Tang et al.

(10) Patent No.: US 9,202,912 B2
(45) Date of Patent: Dec. 1, 2015

(54) LOW COST DEMOS TRANSISTOR WITH IMPROVED CHC IMMUNITY

(71) Applicant: Texas Instruments Incorporated, Dallas, TX (US)

(72) Inventors: Shaoping Tang, Allen, TX (US); Amitava Chatterjee, Plano, TX (US); Imran Mahmood Khan, Richardson, TX (US); Kaiping Liu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/576,693

(22) Filed: Dec. 19, 2014

(65) Prior Publication Data
US 2015/0187938 A1     Jul. 2, 2015

Related U.S. Application Data (60) Provisional application No. 61/921,844, filed on Dec. 30, 2013.

(51) Int. Cl.
| | | |
|---|---|---|
| H01L 29/78 | (2006.01) | |
| H01L 27/092 | (2006.01) | |
| H01L 21/3213 | (2006.01) | |
| H01L 21/8238 | (2006.01) | |
| H01L 21/8234 | (2006.01) | |
| H01L 29/66 | (2006.01) | |
| H01L 21/265 | (2006.01) | |

(52) U.S. Cl.
CPC ...... *H01L 29/7836* (2013.01); *H01L 21/32133* (2013.01); *H01L 21/82385* (2013.01); *H01L 21/823418* (2013.01); *H01L 21/823807* (2013.01); *H01L 21/823814* (2013.01); *H01L 21/823892* (2013.01); *H01L 27/0928* (2013.01); *H01L 29/66575* (2013.01); *H01L 21/26586* (2013.01); *H01L 29/66537* (2013.01); *H01L 29/7833* (2013.01)

(58) Field of Classification Search
USPC .......................................................... 257/369
See application file for complete search history.

(56) References Cited

U.S. PATENT DOCUMENTS

| | | | |
|---|---|---|---|
| 2010/0032756 A1* | 2/2010 | Pendharkar ........... | H01L 21/761 257/337 |
| 2010/0032757 A1* | 2/2010 | Pendharkar ..... | H01L 21/823425 257/337 |
| 2010/0164004 A1* | 7/2010 | Chatterjee ......... | H01L 21/76224 257/369 |
| 2011/0156144 A1* | 6/2011 | Benaissa ......... | H01L 21/823814 257/338 |
| 2012/0112275 A1* | 5/2012 | Steinmann ............ | H01L 29/161 257/335 |
| 2012/0199878 A1* | 8/2012 | Shrivastava ......... | H01L 29/0653 257/192 |
| 2012/0261766 A1* | 10/2012 | Benaissa ......... | H01L 21/823814 257/369 |
| 2014/0183630 A1* | 7/2014 | Hao ................ | H01L 21/823412 257/337 |

\* cited by examiner

*Primary Examiner* — Thao P Le
(74) *Attorney, Agent, or Firm* — Jacqueline J. Garner; Frank D. Cimino (57) ABSTRACT

An integrated circuit and method includes a DEMOS transistor with improved CHC reliability that has a lower resistance surface channel under the DEMOS gate that transitions to a lower resistance subsurface channel under the drain edge of the DEMOS transistor gate.

17 Claims, 10 Drawing Sheets

LOW COST DEMOS TRANSISTOR WITH IMPROVED CHC IMMUNITY

CROSS-REFERENCE TO RELATED APPLICATIONS

This application claims the benefit of priority under U.S.C. §119(e) of U.S. Provisional Application 61/922,844 (filed Dec. 30, 2013), the contents of which are hereby incorporated by reference.

FIELD OF INVENTION

This invention relates to the field of integrated circuits. More particularly, this invention relates to the formation of a drain extended MOS transistor in an integrated circuit.

BACKGROUND

Modern digital VLSI circuits commonly operate at about 0.8 V to 1.2 V. However, circuit requirements often call for additional on chip circuits operating at lower voltages and also operating at higher voltages. Example higher voltage circuits are input/output interface circuits with various off-chip system components such as power management switches, analog input circuits conditioning transducer signals, or output analog drive functions for speakers or other actuators. Example lower voltage circuits are high speed, high performance logic circuits.

Typically high speed, low turn on voltage (vt) transistors are added to the baseline complementary metal-oxide-semiconductor (CMOS) flow by adding additional halo patterning and implantation steps and high voltage transistors are added by introducing a second thicker gate oxide to withstand the higher voltage plus additional steps to set the vt. These additional steps add process complexity and cost.

An alternative solution to add high voltage transistors is to use drain extended metal-oxide-semiconductor (DEMOS) transistors that switch high drain voltages with minimum additional process complexity and cost. In a DECMOS transistor a lightly doped extended drain region is formed between the heavily doped drain contact and the transistor channel region. This region fully depletes when a high voltage is applied to the heavily doped drain contact causing a voltage drop between the drain contact and the transistor gate dielectric. With proper design, sufficient voltage may be dropped between the drain contact and the gate dielectric to allow a low gate voltage transistor to be used for the DEMOS transistor. By using a DEMOS transistor a second thicker gate oxide to accommodate the higher voltage is avoided, and additional pattern and implant steps to set the high voltage vt are avoided significantly reducing cost.

One problem with DEMOS transistors is a reduced breakdown voltage due to impact ionization (BVII) and reduced reliability due to channel hot carrier (CHC) generation near the corner of the DEMOS gate which overlies the drain extension. When the DEMOS transistor is turned on, the electric field is maximum (peak electric field) under the drain end of the DEMOS gate. Impact ionization (CHC generation) occurs when the DEMOS current flows through this region of high electric field. One method to improve BVII and CHC reliability is to move the DEMOS current flow away from the drain edge of the DEMOS gate by counter doping the surface of the extended drain where the peak electric field is formed using a shallow implant with opposite dopant type. This increases the resistance at the surface causing the current to follow a lower resistance subsurface path. This reduces current flow through the peak electric field region resulting in reduced CHC generation, improved CHC reliability, and improved BVII. The counter doping method, often called the floating ring method, adds a floating ring photoresist pattern and also a floating ring implant to the process flow thereby increasing cost.

In a typical CMOS process flow at least three additional patterning and implantation steps are used to add a low voltage NMOS transistor, a low voltage PMOS transistor and a DEPMOS transistor. In addition a fourth patterning and implantation step may be used to add the floating ring implant to improve CHC of the DEPMOS transistor.

SUMMARY

An integrated circuit and method includes a DEMOS transistor with improved CHC reliability that has a lower resistance surface channel under the DEMOS gate that transitions to a lower resistance subsurface channel under the drain edge of the DEMOS transistor gate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Frequently transistors with multiple turn on voltages (vts) are required in an integrated circuit. For example, in addition to core NMOS and PMOS transistors with turn on voltages (nominal vts) set at approximately +/−0.35 volts, low vt transistors with vts set at about +/−0.2 volts may be required for high speed digital circuits. Embodiments below describe a method for forming low vt NMOS and PMOS transistors plus a DEMOS transistor with improved CHC immunity in a core CMOS transistor process flow with the addition of only one photoresist and one ion implantation step.

The term "core CMOS process flow" refers to process flow for manufacturing integrated circuits with core (nominal vt) NMOS and core (nominal vt) PMOS transistors.

Figure 1:
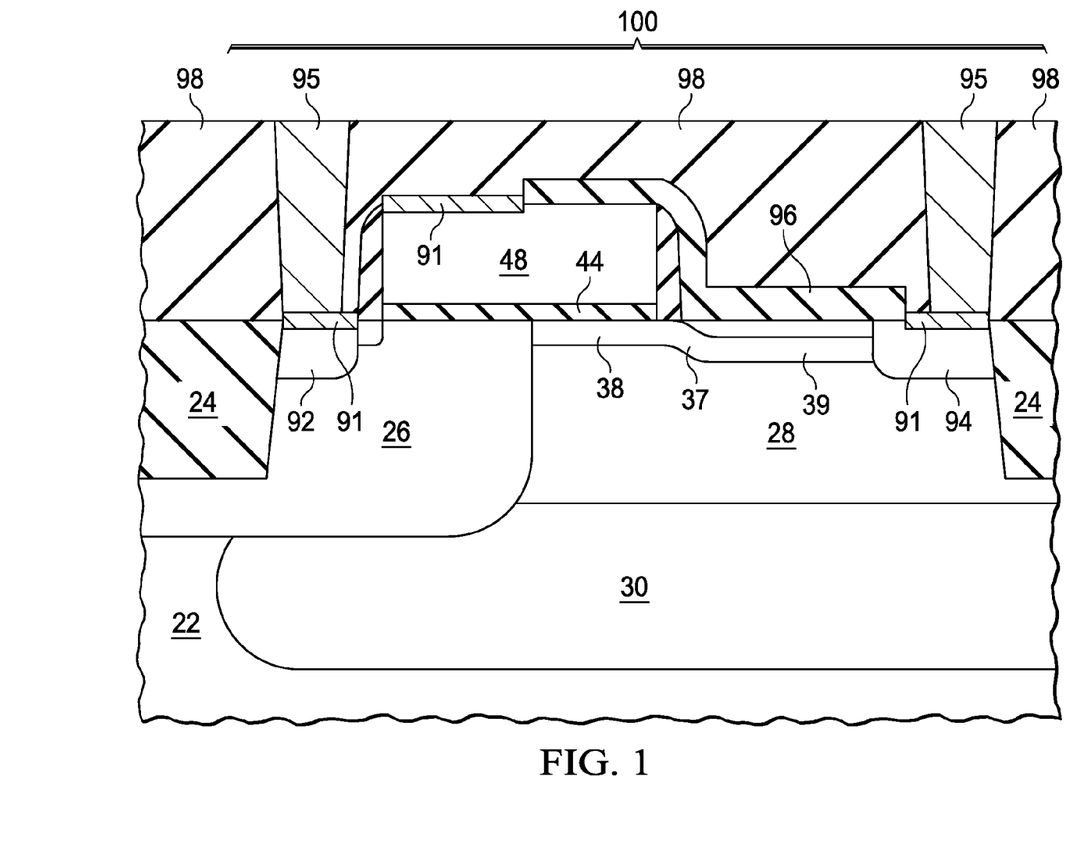
FIG. 1 is a DEMOS transistor with improved CHC reliability.

FIG. 1 shows an extended drain PMOS transistor (DEPMOS) 100 with improved channel hot carrier (CHC) reliability and improved BVII breakdown voltage. The source of the DEPMOS transistor 100 is heavily doped p-type diffusion 92. The drain is lightly doped drain extension 28 and heavily doped p-type diffusion 94. The body is nwell 26. The gate dielectric is 44 and the gate is 48. When a high voltage is applied to the highly doped drain diffusion 94, the lightly doped drain region 28 fully depletes. Sufficient voltage is dropped across the lightly doped extended drain region 28 to protect the gate oxide 44. Typically high voltage DEMOS transistors use the same gate dielectric as the core NMOS and PMOS transistors. Silicide blocking dielectric 96 prevents silicide 91 from forming on and shorting the lightly doped extended drain region 28. Premetal dielectric (PMD) 98 is formed over the DEPMOS transistor and contact plugs 95 are formed through the PMD 98 to electrically connect the DEMOS transistor 100 source 92 and drain 94 diffusions to a first interconnect layer.

Nwell 26 formed in p-type substrate 22 forms the body 26 of the DEPMOS 100 transistor. The nwell 26 and the buried n-type diffusion 30 electrically isolate the lightly doped extended drain region 28 from the substrate 22. Shallow trench isolation (STI) electrically isolates the DEPMOS transistor 100 from other devices in the integrated circuit.

A p-type surface channel 38 with reduced resistance is formed under the gate 48 at the surface of the lightly doped extended drain 28 by implanting dopant through the gate 48. A reduced resistance transition region 37 connects the reduced resistance surface channel 38 to the reduced resistance subsurface channel 39 at the drain edge of the DEMOS transistor 100 gate 48.

When voltage is applied to the gate 48 to turn the DEMOS transistor 100, the peak electric field is formed under the gate 48 at the drain end of the DEMOS gate 48. The transition region 37 diverts the current of the DEPMOS transistor 100 away from the peak electric field. The current is diverted from the surface channel 38 through the lower resistance transition region 37 and into the subsurface channel 39. Diverting the peak current away from the peak electric field significantly reduces CHC generation improving the CHC reliability and significantly increasing the BVII breakdown voltage.

Figure 2:
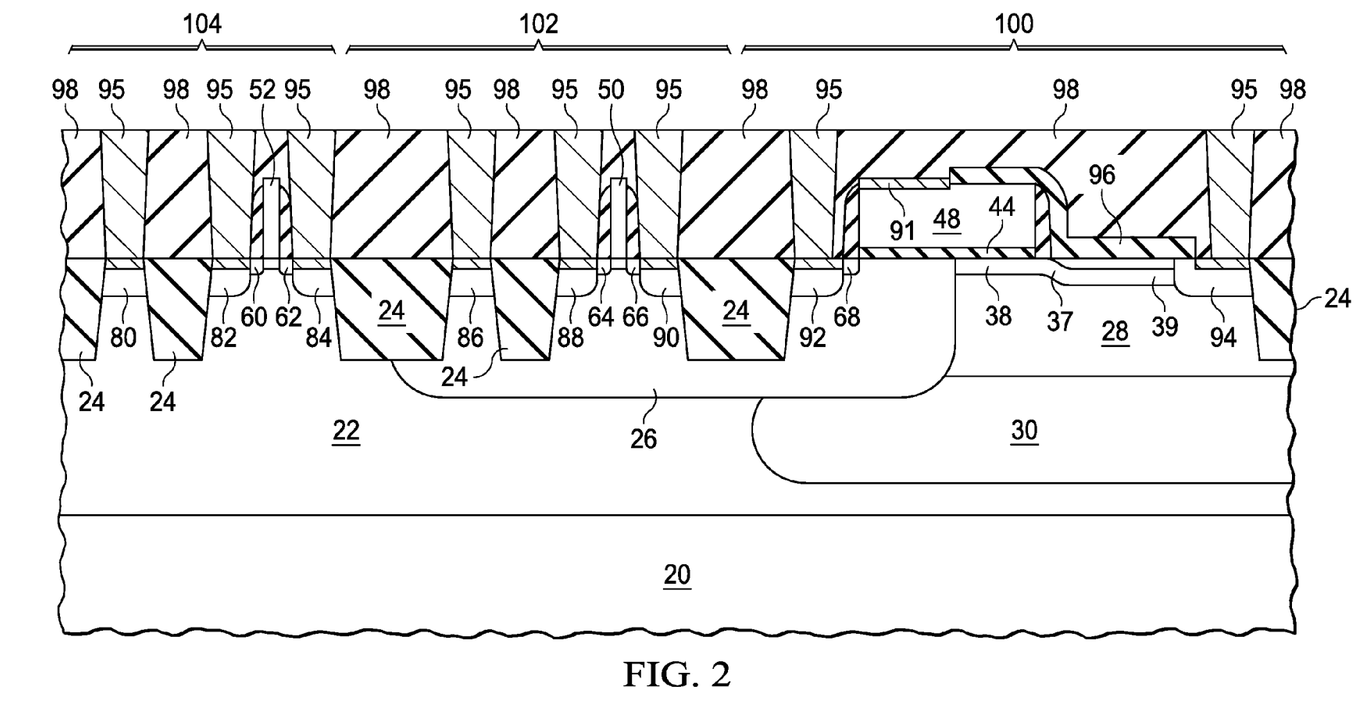
FIG. 2 is and integrated circuit with a low voltage NMOS transistor, a low voltage PMOS transistor and a DEPMOS transistor with improved CHC reliability formed according to principles of the invention.

FIG. 2 shows a portion of an integrated circuit that contains a low voltage NMOS (LVNMOS) transistor 104, a low voltage PMOS (LVPMOS) transistor 102, and a DEPMOS transistor 100. These transistors are formed in a baseline CMOS flow which forms core NMOS transistors and core PMOS transistors with only one additional lithography and implantation step.

The DEPMOS transistor 100 in FIG. 2 is described in FIG. 1.

The gate 52 of the LVNMOS transistor 104, the gate 50 of the LVPMOS transistor 102, and the gate 48 of the DEPMOS transistor 100 are formed on gate dielectric 44 at the same time the gates of the core NMOS and core PMOS transistors are formed.

The turn on voltage (lvtn) of the LVNMOS transistor 104, the turn on voltage (lvtp) of the LVPMOS transistor (102), and the low resistance surface channel 38, the low resistance transition region 37, and low resistance subsurface channel 39 of the DEPMOS transistor 100 are all formed with one lithography and implantation step. These are the only additional processing steps added to the core CMOS flow to form the LVNMOS 104, LVPMOS 102, and DEPMOS 100 transistors.

The nwell contact 86 and the source 82, drain 84, and extensions 60, 62 of the LVNMOS transistor 104 are formed using the same lithography and implantation steps as the core NMOS transistors.

The pwell contact 80 and the source 88, drain 90, and extensions 64, 66 of the LVPMOS transistor 102 and the source 92, drain 94, and extension 68 of the DEPMOS transistor 100 are formed using the same lithography and implantation steps as the core PMOS transistors.

FIGS. 3A-3F describe the major steps according to an embodiment which forms the integrated circuit in FIG. 2

Figure 3A:
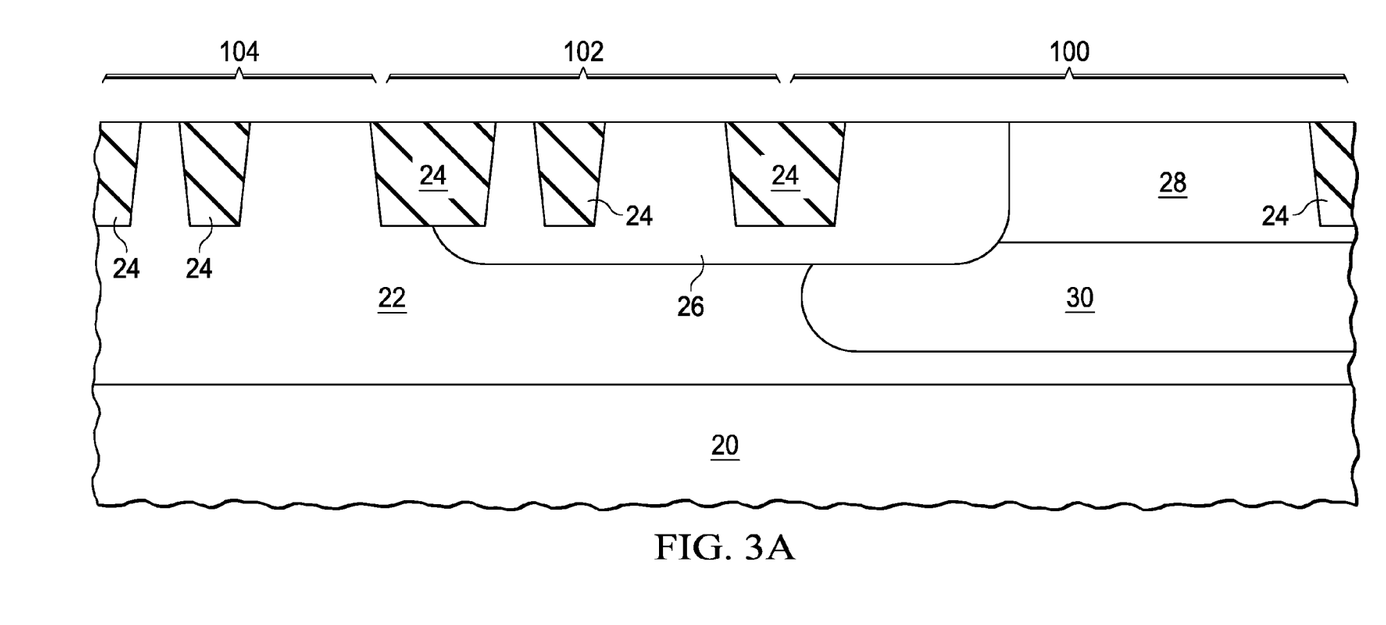
FIGS. 3A-3F are illustrations of steps in the fabrication of an integrated circuit with a low voltage NMOS transistor, a low voltage PMOS transistor and a DEMOS transistor with improved CHC reliability formed according to principles of the invention.

A partially processed CMOS integrated circuit is shown in FIG. 3A. The DEPMOS transistor 100 will be formed using the nwell 26 for the transistor body and the lightly doped isolated pwell 28 for the drain extension. The lightly doped isolated pwell 28 is electrically isolated from the p-type epi layer 22 and the more heavily doped p-type substrate wafer 20, on the sides by a surrounding nwell 26 and on the bottom by the underlying buried n-type layer 30.

The LVPMOS transistor 102 may be formed in nwell 26 and an LVNMOS transistor 104 may be formed in the p-type epi 22 concurrently with the formation of the DEPMOS transistor 100. Core CMOS transistors (not shown) are formed elsewhere in the integrated circuit. Shallow trench isolation (STI) 24 electrically isolates the devices.

Figure 3B:
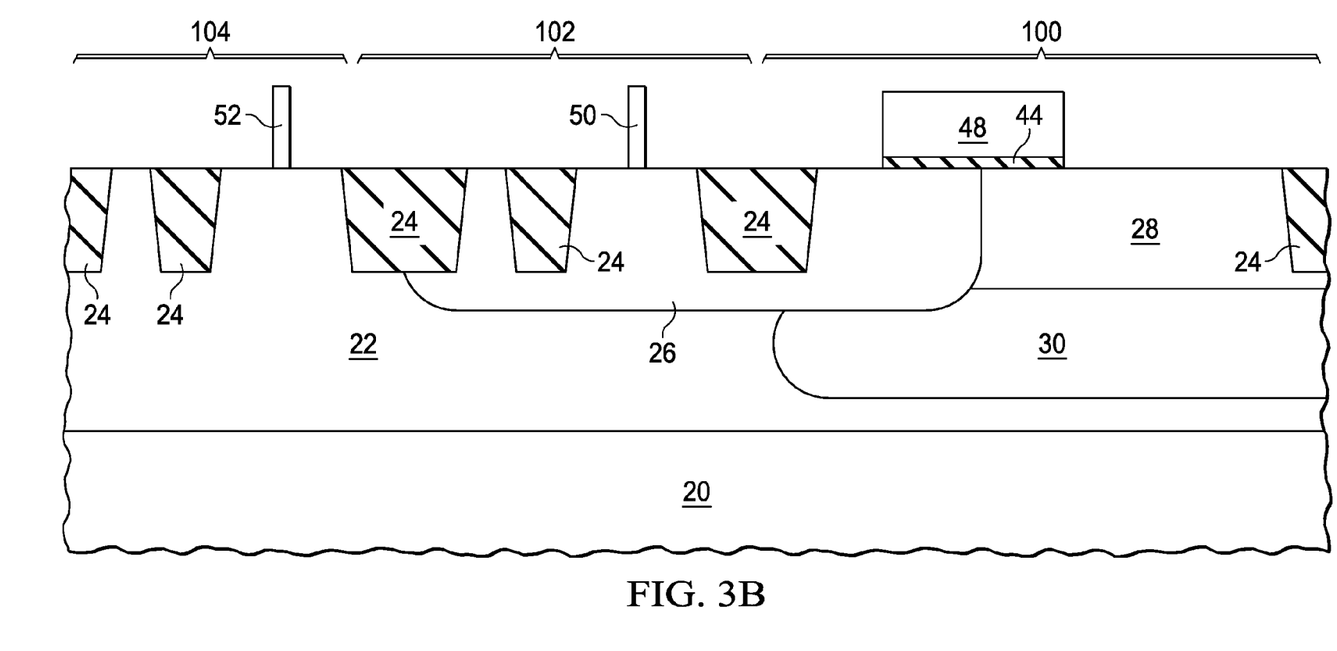

FIG. 3B shows the integrated circuit after gate dielectric 44 is formed and the transistor gate 52 of the LVNMOS 104, the gate 50 of the LVPMOS 102, and the gate 48 of the DEPMOS 100 transistors are formed. The dielectric and gates of the CORE CMOS transistors are also formed at the same time.

Figure 3C:
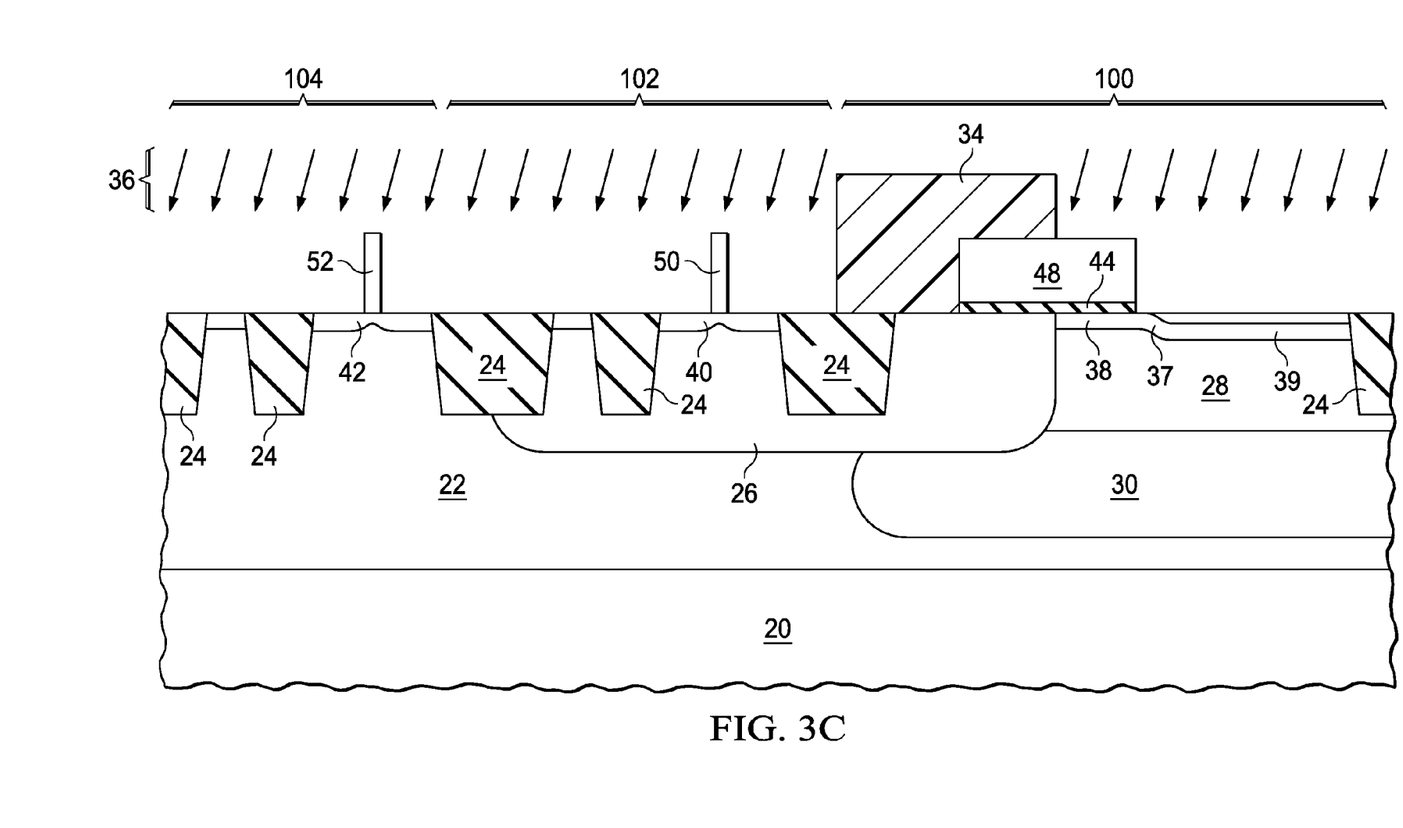

In FIG. 3C a lvt/extended drain implant pattern 34 is formed on the integrated circuit and a p-type lvt/extended drain implantation 36 is performed to set the lvtn in the channel area 42 of the LVNMOS transistor 104, the lvtp in the channel area 40 of the LVPMOS transistor 102, to form the reduced resistance surface channel 38, the reduced resistance transition channel 37, and the reduced resistance subsurface channel 39 in the lightly doped drain 28. The reduced resistance surface channel is formed by implanting through the gate 48 of DEPMOS transistor 100. The reduced resistance subsurface channel 39 is formed by implantation into the surface of the lightly doped extended drain 28 adjacent to the DEMOS transistor 100 gate 48. The reduced resistance transition channel 37 connects the reduced resistance surface channel 38 with the reduced resistance subsurface channel 39 at the drain end of the DEMOS 100 transistor gate 48.

As shown in FIG. 3C the lvt/extended drain implant may be an angled implant with an implant angle between 0 and 30 degrees with rotation. When the angle is greater than 0 degrees rotation is required so that the vt implant will be uniform under the LVNMOS gate 52 and under the LVPMOS 102 gate 50. The angle of the implant may be varied to adjust the position of the reduced resistance channel 37 under the drain end of the DEMOS transistor 100 gate 48. The implant angle may be adjusted to improve CHC reliability and BVII breakdown.

In an example embodiment doping of the p-type epi 22 and the doping of the nwell 26 are designed so that this implant raises the lvtn the LVNMOS transistor 104 from about −0.2 volts to about +0.2, lowers the lvtp of the LVPMOS transistor 102 from about 0.6 to about 0.2 by counterdoping the nwell 26 and forms the lower resistance surface channel 38, transition region 37, and subsurface channel 39 in the extended drain 28. The resistance of the DEPMOS transistor extended drain in 38 and 39. Blocking the implant 36 from the DEPMOS transistor channel region 26 results in a vt of about 0.6 volts for the example embodiment DEPMOS transistor 100. In this embodiment, one patterned implant 36 sets the vts for the LVNMOS and LVPMOS transistors and forms the lower resistance surface channel 38, the lower resistance transition region 37, and the lower resistance subsurface channel 39 in the extended drain 28 of the DEPMOS transistor 100. This one patterned implant 36 also sets the vt for the DEPMOS transistor by blocking the implant from the DEPMOS transistor channel region. The concentration of the pwell 22 and the nwell 26 may be adjusted according to what vt is desired for the NMOS and PMOS transistors. In the example embodiment, the implant angle is about 15 degrees and the concentration of the pwell 22 and nwell 26 are adjusted to give LVNMOS 104 and LVPMOS 102 transistors with approximately matched vts of about +/−0.2 volts.

The lower resistance transition channel 37 from the lower resistance surface channel 38 to the lower resistance subsurface channel 39 at the drain edge of the DEPMOS gate, causes the DEPMOS transistor current to be diverted away from the surface at the drain edge of the DEPMOS transistor where the peak electric field forms. Diverting the DEPMOS transistor current away from the peak electric field significantly reduces CHC formation. CHC reliability of the DEPMOS transistor is improved and also BVII breakdown voltage is improved.

Figure 3D:
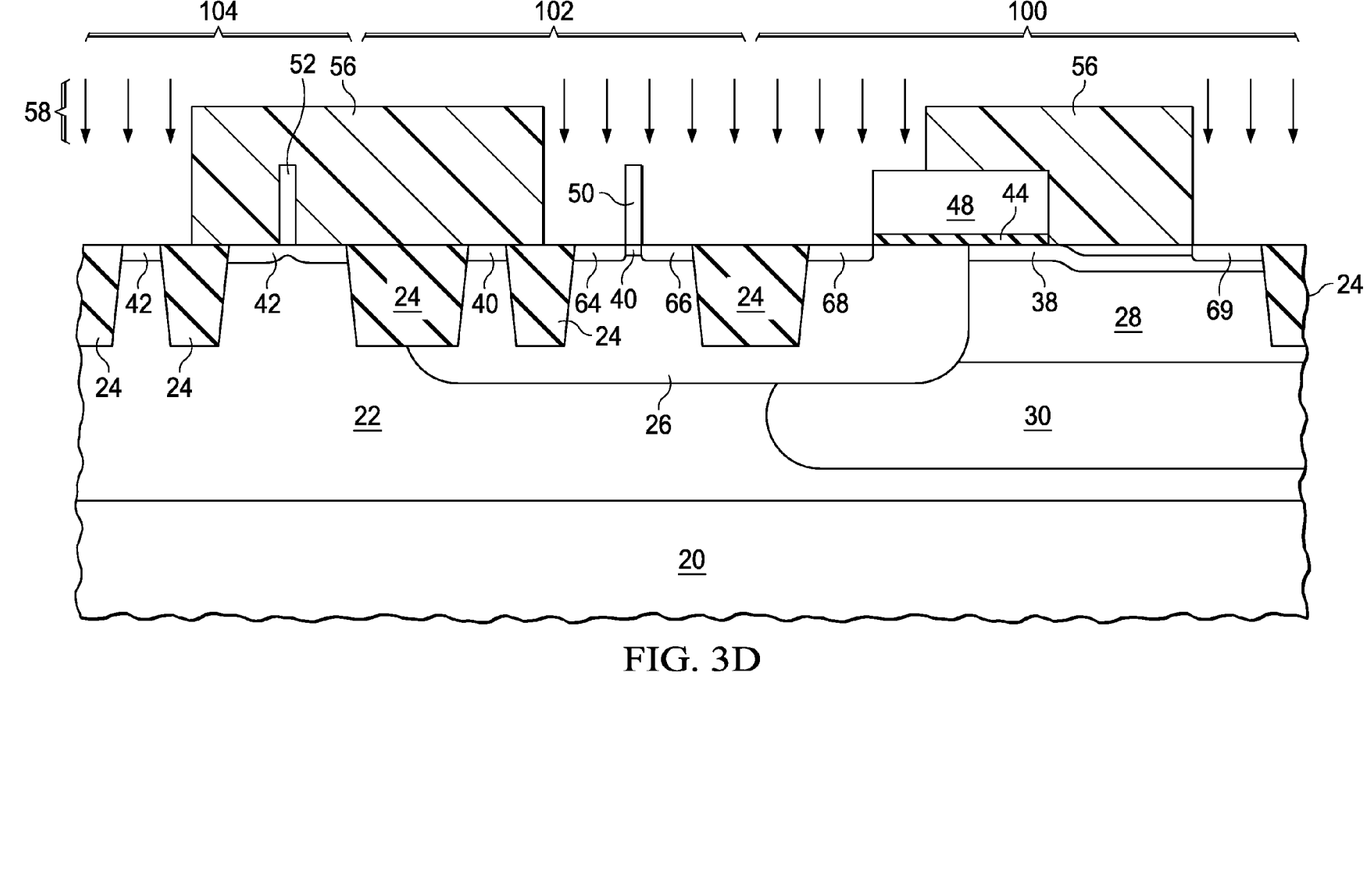

In FIG. 3D a p-type lightly doped drain (PLDD) photo resist pattern 56 is formed on the wafer and p-type dopant 58 is implanted to form source 64 and drain 66 extensions on the LVPMOS transistor 102 and to form the source 68 and drain 69 extensions on the DEPMOS transistor 100. This same pattern and implant forms the source and drain extensions on the core PMOS transistors. N-type halo or pocket implants may also be implanted at this time.

Source 60 (FIG. 3E) and drain 62 extensions are formed on the LVNMOS transistor 104 in like manner with an n-type lightly doped drain (NLDD) photo resist pattern and n-type NLDD implant.

Figure 3E:
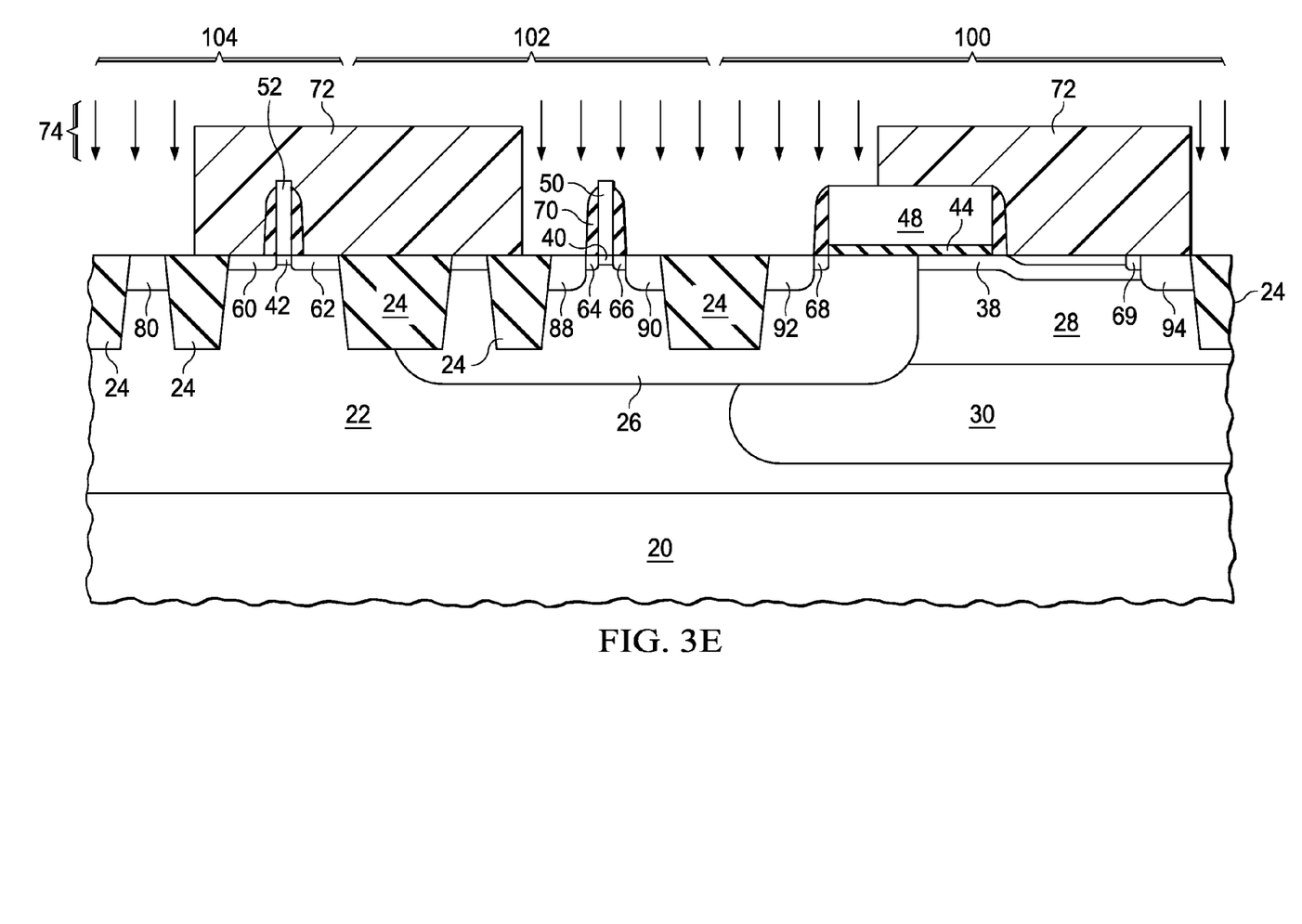

After the extensions, sidewalls 70 are formed on the core CMOS transistors and on the LVNMOS 104, LVPMOS 102, and DEPMOS 100 transistors as is illustrated in FIG. 3E. A PMOS source and drain (PSD) pattern 72 is formed on the integrated circuit and the source and drains of core PMOS transistors, the source 88 and drain 90 of the LVPMOS transistor 102, the source 92 and drain 94 of the DEPMOS transistor 100, and the pwell 22 contact diffusion 80 are formed by implanting a p-type dopant 74 such as B11 or BF2.

Figure 3F:
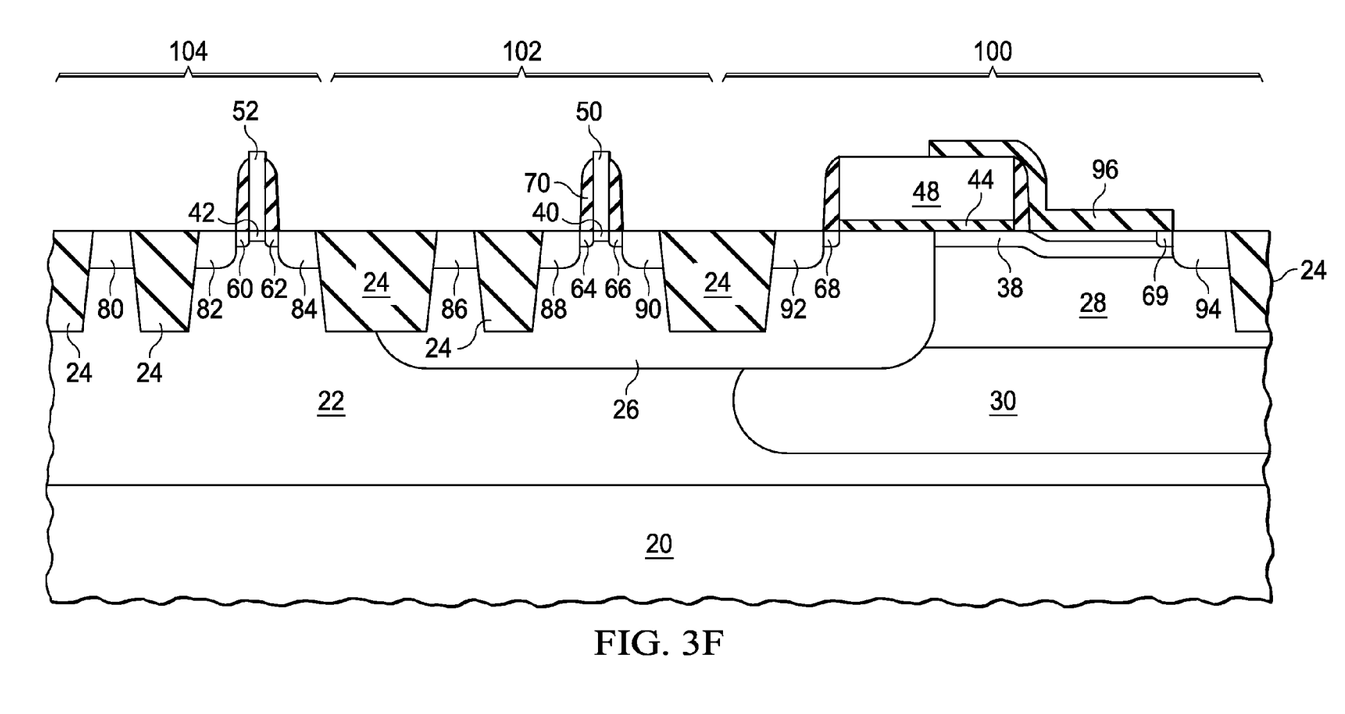

As is illustrated in FIG. 3F, the source 82 and drain 84 diffusions are formed on the LVNMOS transistor 104, and the nwell 26 substrate contact diffusion 86 is formed. These are formed at the same time the source and drain diffusions are formed on the core NMOS transistors in a similar fashion to the PSD source and drains using an NSD pattern plus n-type dopant implants such as arsenic and phosphorus.

As is also illustrated in FIG. 3F, a silicide block geometry 96 is formed over part of the gate 48 of the DEPMOS transistor 100 and over the lightly doped drain 28 to prevent the silicide from shorting the lightly doped drain 28. The silicide block geometry 96 is formed by depositing a silicide block dielectric such as silicon dioxide or silicon nitride, forming resist over the silicide block geometry 96, and then etching away the silicide block dielectric unprotected by resist.

Additional processing including silicide 91 formation, premetal dielectric 98 deposition, and contact plug 95 formation, is performed to produce the integrated circuit illustrated in FIG. 2. A first interconnect level is formed to route signals from the contact plugs 95 to other devices in the integrated circuit. Additional levels of intermetal dielectric (IMD) and interconnect may be added to complete the integrated circuit.

Figure 4:
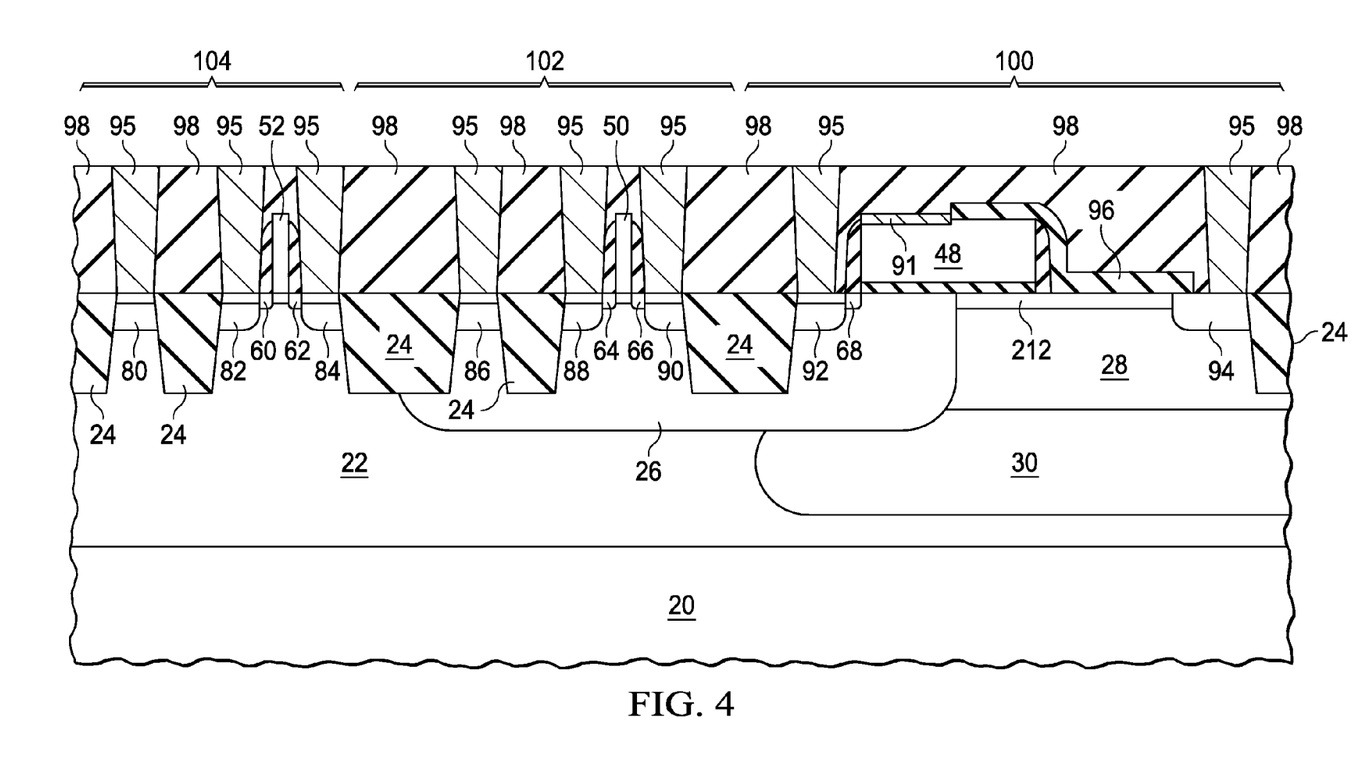
FIG. 4 is and integrated circuit with a low voltage NMOS transistor, a low voltage PMOS transistor and a DEPMOS transistor formed according to principles of the invention.
Figure 5:
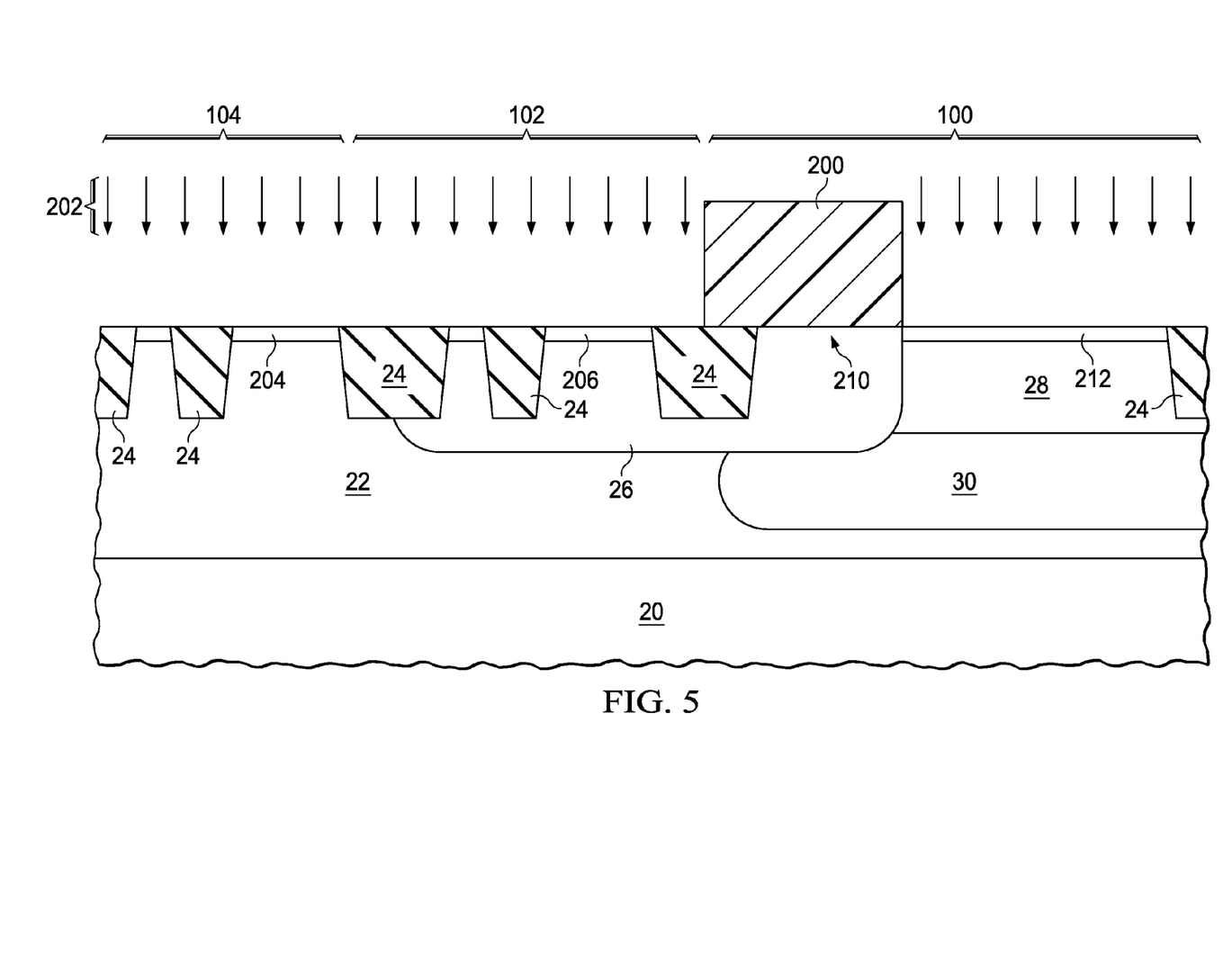
FIG. 5 is an illustration of the step in the fabrication of an integrated circuit with a low voltage NMOS transistor, a low voltage PMOS transistor and a DEMOS transistor shown in FIG. 4 formed according to principles of the invention.

Another embodiment is illustrated in FIGS. 4 and 5. In this embodiment the lvt/extended drain implant that determines the turn on voltage (lvtn) of the LVNMOS transistor 104, the turn on voltage (lvtp) of the LVPMOS transistor, and the reduced resistance surface channel 212 of the DEPMOS transistor 100 is performed prior to the formation of the transistor gates. In the embodiment shown in FIG. 3C, this implant is implanted through the gates 48, 50, and 52 of the transistors 100, 102, and 104.

As is shown in FIG. 5, in this embodiment the implant 202 that dopes the channel 204 of the LVNMOS 104, dopes the channel 206 of the LVPMOS 102, and forms the reduced resistance surface channel 212 in the lightly doped drain 28 of the DEPMOS transistor 100 is implanted prior to the formation of the transistor gates. The lvt/extended drain implant pattern 200 blocks the implant 202 from the body area 210 of the DEPMOS transistor 100 also setting its vt. Except for moving the lvt/extended drain implant from after the formation of the transistor gates to before the formation of the transistor gates, all other processing steps are the same as described in FIGS. 3A through 3F. In this embodiment the implant no reduced resistance transition channel and no reduced resistance subsurface channel is formed in the lightly doped drain 28. No advantage is realized in performing an angled implant.

In an example embodiment doping of the p-type epi 22 and the doping of the nwell 26 are designed so that this implant raises the vt the LVNMOS transistor 104 from about −0.2 volts to about +0.2, lowers the vt of the LVPMOS transistor 102 from about 0.6 to about 0.2 by counter doping the nwell 26 and forms a lower resistance surface channel 212 in the DEMOS transistor extended drain 28. Blocking the implant 202 from the DEMOS transistor channel region 210 results in a vt of about 0.6 volts for the example embodiment DEPMOS transistor 100. In this embodiment, one patterned implant 36 sets the vts for the LVNMOS 104 and LVPMOS 102 transistors and forms the lower resistance surface channel 212 in the extended drain 28 of the DEPMOS transistor 100. This one patterned 200 implant 212 also sets the vt for the DEPMOS transistor by blocking the dopant 202 from the DEPMOS transistor channel region 210. The concentration of the pwell 22 and the nwell 26 may be adjusted according to what vt is desired for the NMOS and PMOS transistors. In the example embodiment, the lvt/extended drain dopant is implanted at zero degrees. The concentration of the pwell 22 and nwell 26 are adjusted to give LVNMOS 104 and LVPMOS 102 transistors with approximately matched vts of about +/−0.2 volts.

This embodiment enables LVNMOS and LVPMOS transistors to be formed along with a DEPMOS transistor with only one additional implant lithography and implantation step.

The embodiments are illustrated with the formation LVTN and LVTP transistors with the formation of a DEPMOS transistor, but as those skilled in the art will appreciate, the embodiments may also be illustrated with the formation of LVTN and LVTP transistors with the formation of a DENMOS transistor. Either one or both of the LVT transistors may be formed with the DEMOS transistor.

Those skilled in the art to which this invention relates will appreciate that many other embodiments and variations are possible within the scope of the claimed invention.

What is claimed is:

1. An integrated circuit, comprising:
a DEMOS transistor further including:
   a body of the DEMOS transistor formed by a well in a substrate of the integrated circuit wherein a doping type of the well is opposite a doping type of the substrate;
   a lightly doped extended drain of the DEMOS transistor wherein the lightly doped extended drain is the same doping type as the substrate and wherein the lightly doped extended drain is electrically isolated from the substrate on the sides by the well and on the bottom by an underlying buried layer of the opposite doping type;
   a gate of the DEMOS transistor wherein a first portion of the gate overlies the body of the DEMOS transistor and a second portion of the gate overlies a portion of the lightly doped extended drain adjacent to the body;
   a reduced resistance surface channel in the lightly doped extended drain under the gate;
   a reduced resistance subsurface channel in the lightly doped extended drain that is not under the gate; and
   a reduced resistance transition channel that couples the reduced resistance surface channel to the reduced resistance subsurface channel.

2. The integrated circuit in claim 1, wherein the substrate doping is p-type, the well doping is n-type, the extended drain doping is p-type and the DEMOS transistor is a DEPMOS transistor.

3. The integrated circuit in claim 1, wherein the substrate doping is n-type, the well doping is p-type, the extended drain doping is n-type and the DEMOS transistor is a DENMOS transistor.

4. The integrated circuit in claim 1 further comprising a low voltage NMOS transistor.

5. The integrated circuit of claim 1 further comprising a low voltage PMOS transistor.

6. The integrated circuit of claim 1 further comprising a low voltage NMOS and a low voltage PMOS transistor.

7. A process of forming an integrated circuit, comprising the steps:
   providing a substrate of a first dopant type;
   forming a well of a second dopant type in the substrate;
   forming a buried diffusion of the second dopant type in the substrate;
   forming a lightly doped extended drain of the first dopant type wherein the lightly doped extended drain is electrically isolated from the substrate on the bottom by the buried diffusion and is electrically isolated from the substrate on the sides by the well;
   forming gate dielectric on the substrate;
   depositing gate material on the gate dielectric;
   forming a gate pattern with a DEMOS gate geometry on the gate material;
   etching the gate material to form a DEMOS gate wherein a first portion of the DEMOS gate overlies the well and a second portion of the DEMOS gate overlies a first portion of the lightly doped extended drain;
   forming a lvt/extended drain implant pattern on the first portion of the DEMOS gate;
   implanting lvt/extended drain dopant of the first doping type through the second portion of the DEMOS gate to form a reduced resistance surface channel under the second portion of the DEMOS gate;
   implanting the lvt/extended drain dopant of the first doping type to form a reduced resistance subsurface channel in a portion of the lightly doped extended drain that is not under the DEMOS gate; and
   implanting the lvt/extended drain dopant to form a reduced resistance transition channel which couples the reduced resistance surface channel to the reduced resistance subsurface channel under a drain end of the DEMOS transistor gate.

8. The process of claim 7, wherein the substrate doping is p-type, the well doping is n-type and the doping of the lightly doped extended drain is p-type and the DEMOS transistor is a DEPMOS transistor.

9. The process of claim 7, wherein the substrate doping is n-type, the well doping is p-type and the doping of the lightly doped extended drain is n-type and the DEMOS transistor is a DENMOS transistor.

10. The process of claim 7, wherein the vt/extended drain implant is implanted at an angle of between 5 degrees and 30 degrees.

11. The process of claim 7, wherein the vt/extended drain implant is implanted at an angle of 15 degrees.

12. The process of claim 7 further comprising the steps:
   forming a first low voltage gate of a first transistor over the substrate;
   forming a second low voltage gate of a second transistor over the well;
   implanting the vt/extended drain dopant into the substrate to set the turn on voltage of the first transistor; and
   implanting the vt/extended drain dopant into the well to set the turn on voltage of the second transistor.

13. The process of claim 12, wherein the DEMOS transistor is DEPMOS, the first transistor is a low voltage NMOS transistor and the second transistor is a low voltage PMOS transistor.

14. The process of claim 12, wherein the DEMOS transistor is DENMOS, the first transistor is a low voltage PMOS transistor and the second transistor is a low voltage NMOS transistor.

15. A process of forming an integrated circuit, comprising the steps:
   providing a substrate of a first dopant type;
   forming a well of a second dopant type in the substrate;
   forming a buried diffusion of the second dopant type in the substrate;
   forming a lightly doped extended drain with the first dopant type wherein the lightly doped extended drain is electrically isolated from the substrate on the bottom by the buried diffusion and is electrically isolated from the substrate on the sides by the well;
   forming a lvt/extended drain implant pattern on the substrate wherein a lvt/extended drain pattern geometry covers a first portion of the well;
   implanting lvt/extended drain dopant of the first doping type into the lightly dope extended drain and forming a lower resistance surface channel;
   implanting lvt/extended drain dopant of the first doping type into the substrate to set the turn on voltage of a first low voltage transistor;
   implanting lvt/extended drain dopant of the first doping type into a second portion of the well to set the turn on voltage of a second low voltage transistor;
   forming gate dielectric on the substrate;
   depositing gate material on the gate dielectric;
   forming a gate pattern on the gate dielectric with gate pattern geometries for the DEMOS transistor, the first transistor, and the second transistor;
   etching the gate material to form the gate of the DEMOS transistor wherein a first portion of the DEMOS gate overlies the first portion of the well and a second portion of the DEMOS gate overlies a portion of the lightly doped extended drain bordering the well;

etching the gate material over the substrate to form the gate of the first transistor; and etching the gate material over the second portion of the well to form the gate of the second transistor.

16. The process of claim 15, wherein the substrate is p-type, the well is n-type, the buried diffusion is n-type, the lightly doped extended drain is p-type, the first transistor is a low voltage NMOS transistor, the second transistor is a low voltage PMOS transistor, and the DEMOS transistor is a DEPMOS transistor.

17. The process of claim 15, wherein the substrate is n-type, the well is p-type, the buried diffusion is p-type, the lightly doped extended drain is n-type, the first transistor is a low voltage PMOS transistor, the second transistor is a low voltage NMOS transistor, and the DEMOS transistor is a DENMOS transistor.

* * * * *